(12) United States Patent
Kobayashi

(10) Patent No.: US 6,704,242 B2
(45) Date of Patent: Mar. 9, 2004

(54) SEMICONDUCTOR INTEGRATED CIRCUIT

(75) Inventor: Hiroyuki Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 4 days.

(21) Appl. No.: 10/279,920

(22) Filed: Oct. 25, 2002

(65) Prior Publication Data

US 2003/0235105 A1 Dec. 25, 2003

(30) Foreign Application Priority Data

Jun. 25, 2002 (JP) .................................... 2002-184544

(51) Int. Cl.[7] ............................................. G11C 8/00
(52) U.S. Cl. ............................ 365/230.08; 365/189.05
(58) Field of Search ....................... 365/230.08, 189.05, 365/154

(56) References Cited

U.S. PATENT DOCUMENTS 4,751,681 A * 6/1988 Hashimoto ............ 365/189.05
6,538,933 B2 * 3/2003 Akioka et al. .......... 365/230.08

* cited by examiner

*Primary Examiner*—Huan Hoang
(74) *Attorney, Agent, or Firm*—Arent Fox Kintner Plotkin & Kahn, PLLC

(57) ABSTRACT

An input part and a feedback part are arranged in series between a second power supply line and input nodes of inverting circuits. The input part connects the second power supply line to one of the input nodes of the inverting circuits in accordance with an input signal. One of the inverting circuits operates so that a logical value corresponding to the input signal is latched into a latching part. The feedback part connects only one of the input nodes to the input part in accordance with an output level of the latching part, thereby fixing the latching state of the latching part. Since the number of stages of circuits from the input part to the latching part can be reduced, the input signal can be latched reliably even when the power supply voltages are low.

28 Claims, 12 Drawing Sheets

SEMICONDUCTOR INTEGRATED CIRCUIT

BACKGROUND OF THE INVENTION

1. Field of the Invention

The present invention relates to a semiconductor integrated circuit having input circuits for receiving input signals.

2. Description of the Related Art

Recently, semiconductor integrated circuits are ever decreasing in power supply voltage (operation voltage) for the sake of finer transistor structures, reduced power consumption, and so on. The threshold voltages of the transistors hardly depend on the power supply voltage. With the decreasing power supply voltage, the threshold voltages of the transistors thus increase in relation to the power supply voltage. As a result, circuits made of transistors tend to decrease in operation margin.

FIG. 1 shows an example of an input circuit for receiving an input signal supplied from exterior.

The input circuit has a latching part 1, a precharging part 2, a feedback part 3, an input part 4, a power supply connection part 5, and a buffer part 6. The latching part 1 is composed of two CMOS inverters 1a and 1b having inputs and outputs connected to each other. The precharging part 2 is composed of two pMOS transistors 2a and 2b which are connected at their drains to the input nodes ND1 and ND2 of the CMOS inverters 1a and 1b, respectively. The pMOS transistors 2a and 2b are connected to a power supply line VDD at their sources, and receive a clock signal CLK at their gates.

The feedback part 3 is composed of two nMOS transistors 3a and 3b which are connected at their drains to the sources of the nMOS transistors of the CMOS inverters 1a and 1b. The gates of the nMOS transistors 3a and 3b receive the inverted levels of the nodes ND2 and ND1 (/ND2 and /ND1) which are supplied through the buffer part 6, respectively. The input part 4 is composed of nMOS transistors 4a and 4b which are connected at their drains to the sources of the nMOS transistors of the CMOS inverters 1a and 1b. The gates of the nMOS transistors 4a and 4b receive an input signal IN and a reference voltage VREF, respectively. The reference voltage VREF is set at a central voltage between the high-level voltage and low-level voltage of the input signal IN.

The power supply connection part 5 consists of an nMOS transistor 5a which is connected at its drain to the sources of the nMOS transistors 3a, 3b, 4a, and 4b. The nMOS transistor 5a is connected to a ground line VSS at its source, and receives the clock signal CLK at its gate. The buffer part 6 has inverters 6a and 6b for inverting the logic levels of the nodes ND1 and ND2, respectively, and an output circuit 6c. The output circuit 6c has a pMOS transistor and an nMOS transistor arranged in series between the power supply line VDD and the ground line VSS. The gate of the pMOS transistor of the output circuit 6c is connected to the node /ND1 through an inverter. The gate of the nMOS transistor of the output circuit 6c is connected to the node /ND2.

In the input circuit shown in FIG. 1, when the clock signal CLK is at low level, the pMOS transistors 2a and 2b of the precharging part 2 turn on so that the input nodes ND1 and ND2 of the CMOS inverters 1a and 1b both change to high level. Here, the nMOS transistor 5a is off. While the nodes ND1 and ND2 are at high level, the outputs of the inverters 6a and 6b of the buffer part 6, i.e., the nodes /ND1 and /ND2 are low in level, turning off the nMOS transistors 3a and 3b of the feedback part 3.

Next, the input signal IN is supplied before the clock signal CLK changes to high level. The clock signal CLK of high level turns off the pMOS transistors 2a, 2b of the precharging part 2 and turns on the nMOS transistor 5a of the power supply connection part 5. For example, if the input signal is at high level (a voltage higher than the reference voltage VREF), the source-to-drain resistance of the nMOS transistor 4b becomes lower than that of the nMOS transistor 4a. Consequently, the node ND1 falls below the node ND2 in voltage. The source-to-drain resistance of the pMOS transistor 1a becomes lower than that of the pMOS transistor 1b. As a result, the node ND2 rises in voltage and the node ND1 falls in voltage. That is, the high level of the input signal IN is latched into the latching part 1.

The low level of the node ND1 and the high level of the node ND2 change the nodes /ND1 and /ND2 to high level and low level, respectively. The output circuit 6c of the buffer part 6 receives the low level of the node /ND2 and the inverted level (low level) of the node /ND1, and changes the output signal OUT to high level. That is, the logic level of the input signal IN latched in the latching part 1 is output.

Since the nMOS transistor 3b of the feedback part 3 turns on in response to the high level of the node /ND1, the latching state of the latching part 1 is fixed regardless of the level of the input signal IN. The latching part 1 latches the input signal IN until the clock signal CLK changes to low level.

FIG. 2 shows another example of the input circuit. This input circuit is the input circuit shown in FIG. 1, inverted in polarity. More specifically, the nMOS transistors and pMOS transistors, as well as the power supply line VDD and ground line VSS, are replaced with each other.

The input circuit has a latching part 1, a precharging part 7, a feedback part 8, an input part 9, a power supply connection part 10, and a buffer part 11. The precharging part 7 is composed of two nMOS transistors, 7a and 7b which are connected at their drains to the input nodes ND1 and ND2 of the CMOS inverters 1a and 1b, respectively. The nMOS transistors 7a and 7b are connected to a ground line VSS at their sources, and receive a clock signal /CLK at their gates. The clock signal /CLK is the clock signal CLK inverted in phase.

The feedback part 8 is composed of two pMOS transistors 8a and 8b which are connected at their drains to the sources of the pMOS transistors of the CMOS inverters 1a and 1b. The gates of the pMOS transistors 8a and 8b receive the inverted levels of the nodes ND2 and ND1 (/ND2 and /ND1) which are supplied through the buffer part 11, respectively. The input part 9 is composed of pMOS transistors 9a and 9b which are connected at their drains to the sources of the pMOS transistors of the CMOS inverters 1a and 1b. The gates of the pMOS transistors 9a and 9b receive an input signal IN and a reference voltage VREF, respectively.

The power supply connection part 10 is connected at its drain to the sources of the pMOS transistors 8a, 8b, 9a, and 9b, is connected at its source to a power supply line VDD, and receives the clock signal /CLK at its gate. The buffer part 11 has inverters 11a and 11b for inverting the levels of the nodes ND1 and ND2, respectively, and an output circuit 11c. The output circuit 11c has a pMOS transistor and an nMOS transistor arranged in series between the power supply line VDD and the ground line VSS. The gate of the pMOS transistor of the output circuit 11c is connected to the node /ND1. The gate of the nMOS transistor of the output circuit 11c is connected to the node /ND2 through an inverter.

In the input circuit shown in FIG. 2, when the clock signal /CLK is at high level, the nMOS transistors 7a and 7b of the precharging part 7 turn on so that the input nodes ND1 and ND2 of the CMOS inverters 1a and 1b both change to low level. Then, the input signal IN is supplied before the clock signal /CLK changes to low level. Then, either one of the nodes ND1 and ND2 changes to high level, and the other to low level. Subsequently, in accordance with the voltages of the nodes ND1 and ND2, either one of the pMOS transistors 8a and 8b of the feedback part 8 turns on so that the latching state is fixed until the clock signal /CLK changes to high level.

In the input circuit shown in FIG. 1, three nMOS transistors (for example, the nMOS transistors 5a, 4a, and the nMOS transistor of the CMOS inverter 1a) are connected in series between the ground line VSS and the nodes ND1, ND2. Similarly, in the input circuit shown in FIG. 2, three pMOS transistors are connected in series between the power supply line VDD and the nodes ND1, ND2. Consequently, when the foregoing input circuits are mounted on semiconductor integrated circuits of lower power supply voltages, it becomes harder for the ground voltage VSS (or the power supply voltage VDD) to be supplied to the latching part 1. This results in a smaller voltage difference between the nodes ND1 and ND2, so that the latching part 1 may latch incorrect data because of slight power supply noise etc.

Additionally, in FIG. 1, the nMOS transistor 4a for receiving the reference voltage VREF is connected to the ground line VSS through the nMOS transistor 5a. Similarly, in FIG. 2, the pMOS transistor 9a for receiving the reference voltage VREF is connected to the power supply line VDD through the pMOS transistor 10a. On this account, the nMOS and pMOS transistors 4a and 9b are more likely to vary in source and drain voltages when the input circuits are in operation. In consequence, if the reference voltage VREF varies due to coupling noise in latching the input signal IN, the input signal IN to be supplied in synchronization with the next clock signal CLK (or /CLK) may not be latched correctly.

SUMMARY OF THE INVENTION

It is an object of the present invention to provide a semiconductor integrated circuit having an input circuit capable of receiving an input signal with reliability. In particular, the object is to receive the input signal reliably when the power supply voltage is low.

According to one of the aspects of the semiconductor integrated circuit of the present invention, an input circuit includes a latching part, a power supply connection part, an input part, and a feedback part. In this input circuit, the power supply connection part firstly connects inverting circuits of the input circuit to a first power supply line in response to an activation of a control signal, the first power supply line being supplied with the first power supply voltage. An input switch circuit of the input part connects a second power supply line to one of the input nodes of the inverting circuits through the feedback part in accordance with the input signal, the second power supply line being supplied with the second power supply voltage. Since one of the inverting circuits operates, the latching part is forced into an unbalanced state to latch a logical value corresponding to the input signal. A feedback switch circuit of the feedback part connects only one of the input nodes to the input part in accordance with a level of an output signal output from the latching part. Then, the latching state of the latching part is fixed.

The input part and the feedback part are arranged in series between the second power supply line and the input nodes of the inverting circuits. That is, the input part is connected directly to the input nodes through the latching part. Since a voltage corresponding to the input signal can be supplied to the input nodes directly, a voltage difference between the input nodes of the inverting circuits can be widened quickly in accordance with the input signal. Thus, the input signal can be latched into the latching part with reliability. Since the number of stages of circuits from the input part for receiving the input signal to the latching part can be reduced, the input signal can be latched with reliability even when the power supply voltages are low (even when the difference between the first power supply voltage and the second power supply voltage is small).

According to another aspect of the semiconductor integrated circuit of the present invention, an input circuit includes a latching part, a power supply connection part, an input part, and a feedback part. In this input circuit, the power supply connection part firstly connects inverting circuits of the input circuit to a first power supply line in response to an activation of a control signal, the first power supply line being supplied with the first power supply voltage. An input switch circuit of the input part connects a second power supply line to one of the inverting circuits in accordance with the input signal, the second power supply line being supplied with the second power supply voltage. Since one of the inverting circuits operates, the latching part is forced into an unbalanced state to latch a logical value corresponding to the input signal. A feedback switch circuit of the feedback part connects only one of the input nodes to the second power supply line in accordance with a level of an output signal output from the latching part. Then, the latching state of the latching part is fixed.

The input part and the feedback part are arranged in parallel between the second power supply line and the inverting circuits. That is, the second power supply line is connected directly to the inverting circuits through the input part. Since the second power supply line can be connected directly to the inverting circuits according to the input signal, a voltage difference between the input nodes of the inverting circuits can be widened quickly in accordance with the input signal. Thus, the input signal can be latched into the latching part with reliability. Since the number of stages of circuits from the input part for receiving the input signal to the latching part can be reduced, the input signal can be latched with reliability even when the power supply voltages are low (even when the difference between the first power supply voltage and the second power supply voltage is small).

According to another aspect of the semiconductor integrated circuit of the present invention, a precharging part sets the input nodes of the inverting circuits at a predetermined voltage when the control signal is inactivated. By putting the inverting circuits in an identical state before the latching part operates, the latching part can be quickly rendered out of balance in order to make itself such a state that corresponds to the input signal.

According to another aspect of the semiconductor integrated circuit of the present invention, the output signal is amplified through a buffer part. Supplying the output signal to the feedback part allows a reduction in the time required for determining the latching state of the latching part.

According to another aspect of the semiconductor integrated circuit of the present invention, the input circuit is composed of pMOS transistors and nMOS transistors. The input nodes of the inverting circuits are connected to the second power supply line through two stages-of transistors (pMOS or nMOS transistors of the input part and the feedback part). Consequently, it becomes easier for the second power supply voltage to be transmitted to the input nodes in accordance with the input signal. The input signal can thus be latched with reliability even when the difference between the first power supply voltage and the second power supply voltage is small. As a result, the operation margin can be improved in the case of lower power supply voltages.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
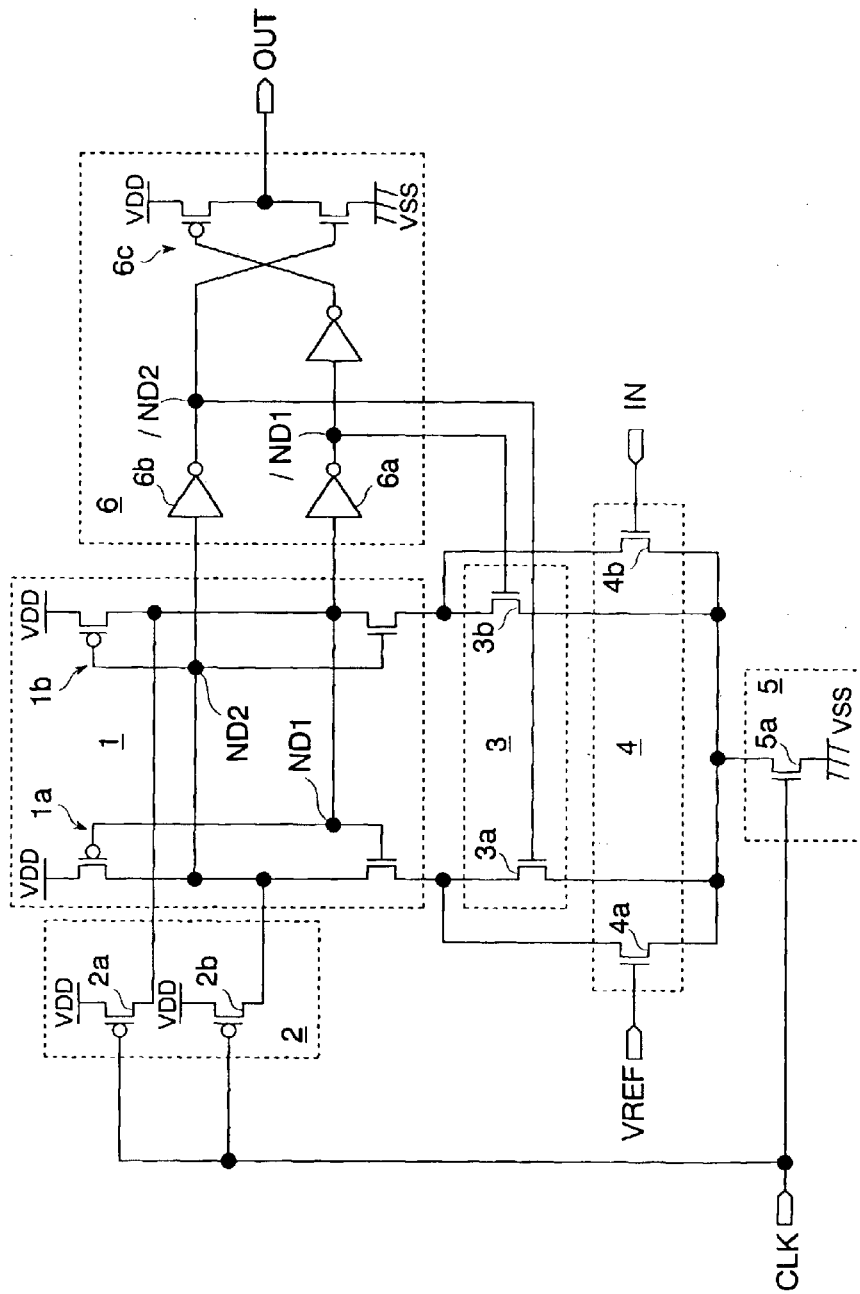
FIG. 1 is a circuit diagram showing a conventional input circuit.

Hereinafter, embodiments of the present invention will be described with reference to the drawings. In the drawings, each thick line represents a signal line that consists of a plurality of lines.

Figure 3:
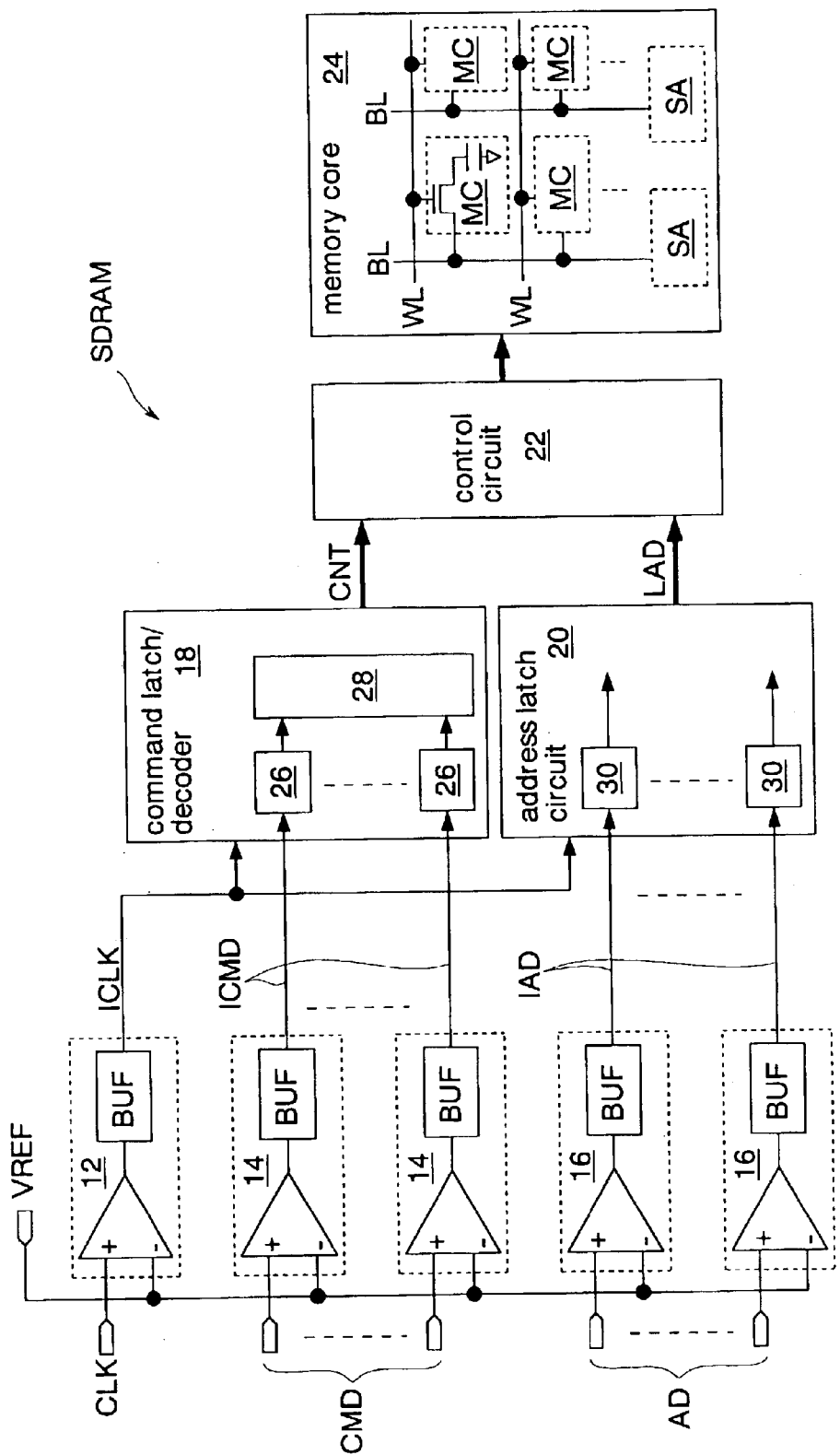
FIG. 3 is a block diagram showing a first embodiment of the semiconductor integrated circuit of the present invention.

FIG. 3 shows a first embodiment of the semiconductor integrated circuit of the present invention.

The semiconductor integrated circuit is formed as a clock synchronous SDRAM (Synchronous DRAM) on a silicon substrate by using CMOS process technology.

The SDRAM has a clock buffer 12 for receiving a clock signal (control signal) CLK, command buffers 14 for receiving a command signal CMD which consists of a plurality of bits, address buffers 16 for receiving an address signal AD which consists of a plurality of bits, a command latch/ decoder 18, an address latch circuit (address receiver circuit) 20, a control circuit 22, and a memory core 24. Incidentally, aside from those shown in FIG. 3, the SDRAM also has data buffers, a data latch circuit, a data control circuit and so on for inputting/outputting a data signal. The data latch circuit has input circuits for latching the data signal in synchronization with the clock signal CLK.

The clock buffer 12, the command buffers 14, and the address buffers 16 each have a differential input circuit including a current mirror circuit, and a buffer BUF. The clock buffer 12 outputs the received clock signal CLK as an internal clock signal ICLK. The command buffers 14 output the received command signal CMD as an internal command signal ICMD. The address buffers 16 receive an address signal AD for selecting memory cells MC to be subjected to a write operation or a read operation, and output the received address signal AD as an internal address signal IAD.

The command latch/decoder 18 has input circuits 26 for receiving the internal command signal ICMD in synchronization with the internal clock signal ICLK, and a command decoder 28 for decoding the internal clock signal ICLK received. According to the decoding result, the command latch/decoder 18 outputs a core control signal CNT for performing a write operation or a read operation on the memory core 24.

The address latch circuit 20 has input circuits 30 which receive the internal address signal IAD in synchronization with the internal clock signal ICLK and output the received signal as a latched address signal LAD.

The control circuit 22 receives the core control signal CNT and the latched address signal LAD, and outputs a control signal for operating the memory core 24 to this memory core 24.

The memory core 24 has memory cells MC arranged in a matrix, word lines WL and bit lines BL connected to the memory cells MC, and sense amplifiers SA connected to the bit lines BL. The memory cells MC are the same as typical DRAM memory cells, each having a capacitor for retaining data in the form of a charge and a transfer transistor arranged between this capacitor and a bit line BL The gate of the transfer transistor is connected to word line WL.

The memory core 24 starts its operation in response to the control signal from the control circuit 22, and selects a word line(s) WL in accordance with the latched address signal LAD. Through the selection of the word line(s) WL, any one of a read operation, a write operation, and a refresh operation is performed.

Figure 4:
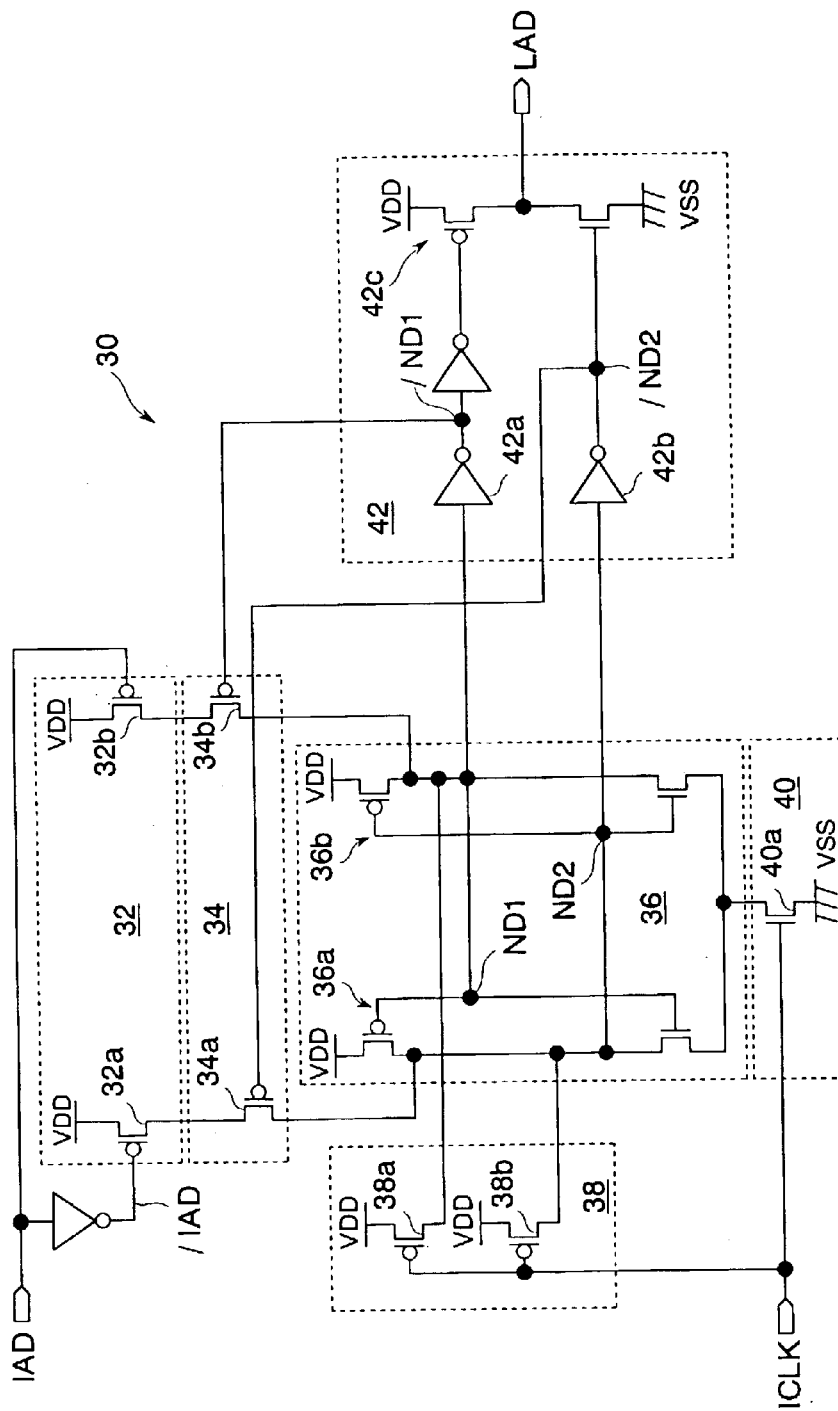
FIG. 4 is a circuit diagram showing the details of the input circuits of FIG. 3.

FIG. 4 shows the details of the input circuits 30 in the address latch circuit 20 shown in FIG. 3. Incidentally, the input circuits 26 of the command latch/decoder 18 and the input circuits of the data latch circuit are the same circuits as the input circuits 30. Description will thus be omitted of these input circuits.

An input circuit 30 has an input part 32, a feedback part 34, a latching part 36, a precharging part 38, a power supply connection part 40, and a buffer part 42.

The input part 32 is composed of pMOS transistors 32a and 32b (input switch circuit) which are connected to the feedback part 34 at their drains. The gates of the pMOS transistors 32a and 32b receive the internal address signal IAD inverted in phase, or an internal address signal /IAD, and the internal address signal IAD, respectively. The sources of the pMOS transistors 32a and 32b are connected to a power supply line (second power supply line) VDD to which a power supply voltage (second power supply voltage) VDD is supplied. In this embodiment, the power supply voltage VDD is set at 2.3 V.

The feedback part 34 is composed of pMOS transistors 34a and 34b (feedback switch circuit) which are connected at their drains to the input nodes ND1 and ND2 of CMOS inverters 36a and 36b to be described later (=the output nodes ND2 and ND1 of the CMOS inverters 36a and 36b), respectively. The gates of the pMOS transistors 34a and 34b receive the inverted levels of the nodes ND2 and ND1 (/ND2 and /ND1), respectively, which are supplied through the buffer part 42.

The latching part 36 is composed of the CMOS inverters 36a and 36b which have inputs and outputs connected to each other. The sources of the pMOS transistors of the CMOS inverters 36a and 36b are connected to the power supply line VDD. The sources of the nMOS transistors of the CMOS inverters 36a and 36b are connected to the power supply connection part 40.

The precharging part 38 is composed of pMOS transistors 38a and 38b which are connected at their drains to the input nodes ND1 and ND2 of the CMOS inverters 36a and 36b, respectively. The pMOS transistors 38a and 38b are connected to the power supply line VDD at their sources, and receive the internal clock signal ICLK at their gates.

The power supply connection part 40 consists of an nMOS transistor 40a which is connected at its drain to the sources of the nMOS transistors of the CMOS inverters 36a and 36b. The nMOS transistor 40a is connected at its source to a ground line (first power supply line) VSS to which a ground voltage (first power supply voltage) VSS is supplied. The nMOS transistor 40a receives the internal clock signal ICLK at its gate.

The buffer part 42 has inverters 42a and 42b for inverting the logic levels of the nodes ND1 and ND2, respectively, and an output circuit 42c. The output circuit 42c has a pMOS transistor and an nMOS transistor arranged in series between the power supply line VDD and the ground line VSS. The gate of the pMOS transistor of the output circuit 42c is connected to the node /ND1 through an inverter. The gate of the nMOS transistor of the output circuit 42c is connected to the node /ND2. The buffer part 42 outputs the latched address signal LAD, a signal of the same logic level as that of the internal address signal IAD received by the input part 32.

In the input circuit 30 shown in FIG. 4, when the internal clock signal ICLK (clock signal CLK) is at low level, the pMOS transistors 38a and 38b of the precharging part 38 turn on so that the input nodes ND1 and ND2 of the CMOS inverters 36a and 36b both change to high level. Here, the nMOS transistor 40a of the power supply connection part 40 is off. While the nodes ND1 and ND2 are at high level, the outputs of the inverters 42a and 42b of the buffer part 42, i.e., the nodes /ND1 and /ND2 are low in level, turning on the pMOS transistors 34a and 34b of the feedback part 34. Consequently, when the internal clock signal ICLK is inactivated, the input nodes ND1 and ND2 of the CMOS inverters 36a and 36b are connected to the pMOS transistors 32a and 32b of the input part 32 through the pMOS transistors 34a and 34b of the feedback part 34.

Next, the internal address signal IAD is supplied before the internal clock signal ICLK changes to high level (an activated state). The internal clock signal ICLK of high level turns off the pMOS transistors 38a, 38b of the precharging part 38 and turns on the nMOS transistor 40a of the power supply connection part 40. Since the nMOS transistor 40a is turned on, the latching part 36 is activated to be capable of latching the internal address signal IAD.

For example, when the internal address signal IAD is at high level, the pMOS transistor 32a turns on and the pMOS transistor 32b turns off. Since the pMOS transistors 34a and 34b of the feedback part 34 are on, the node ND2 alone is connected to the power supply line VDD through the pMOS transistors 32a and 34a. The node ND2 rises in voltage and the node ND1 falls in voltage, turning off the pMOS transistor 36b and on the pMOS transistor 36a of the CMOS inverter 36. Then, the internal address signal IAD of high level is latched into the latching part 36.

Figure 2:
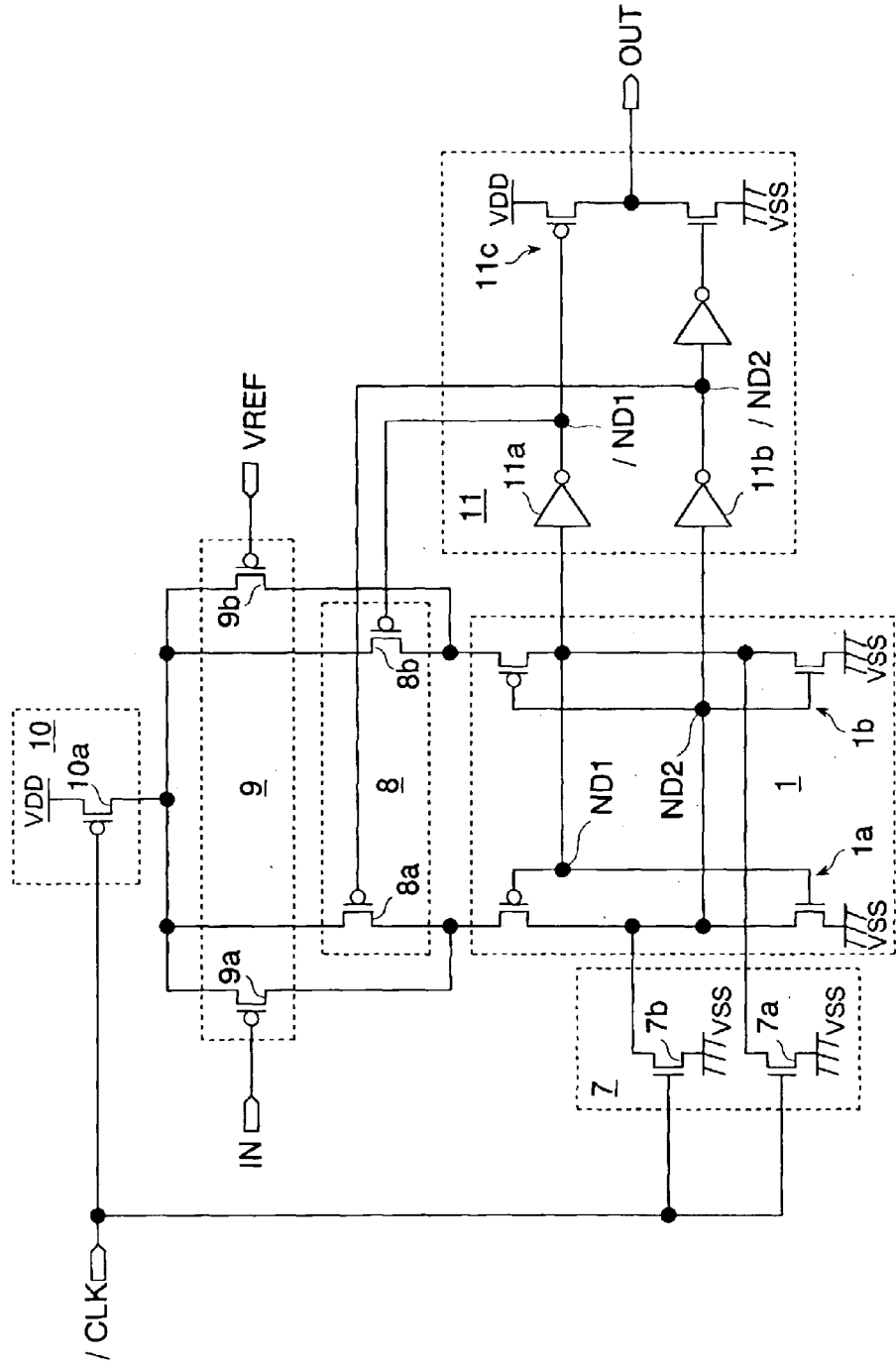
FIG. 2 is a circuit diagram showing another example of the conventional input circuit.

In this embodiment, the input node ND1 of the CMOS inverter 36a is connected to the power supply line VDD through the pMOS transistors 32a and 34a. Similarly, the input node ND2 of the CMOS inverter 36b is connected to the power supply line VDD through the pMOS transistors 32b and 34b. That is, the input nodes ND1 and ND2 are connected to the power supply line VDD through two stages of transistors connected in series. This is one stage fewer than heretofore (FIGS. 1 and 2). Consequently, even if the power supply voltage VDD is as low as 2.3 V, the voltage difference between the nodes ND1 and ND2 can be widened quickly and surely in accordance with the internal address signal IAD. In addition, the pMOS transistors 32a and 32b, both having an amplifying function, are directly connected to the power supply line VDD at their sources. Small changes in the voltage of the internal address signal IAD can thus be amplified and output to the drains of the pMOS transistors 32a and 32b quickly with reliability. As a result, the operation margin of the input circuits 30 (and the input circuits 26) with respect to the power supply voltage improves as compared to heretofore.

The inverters 42a and 42b of the buffer part 42 amplify the low level of the node ND1 and the high level of the node ND2, whereby the nodes /ND1 and /ND2 are changed to the power supply voltage VDD and the ground voltage VSS, respectively. The output circuit 42c of the buffer part 42 receives the low level of the node /ND2 and the inverted level (low level) of the node /ND1, and changes the latched address signal LAD to high level. That is, the logic level of the internal address signal IAD latched in the latching part 36 (the power supply voltage VDD) is output.

Moreover, the pMOS transistor 34a of the feedback part 34 remains turned on under the low level of the node /ND2. The pMOS transistor 34b of the feedback part 34 is turned off in response to the high level of the node /ND1. The input node ND2 of the CMOS inverter, 36a is connected to the power supply line VDD through the pMOS transistors 32a and 34a, so that the latching state of the latching part 36 is fixed irrespective of the level of the internal address signal IAD. Since the output signals (nodes ND1 and ND2) of the latching part 36 amplified by the inverters 42a and 42b are supplied to the feedback part 34, the feedback operation can be performed at high speed. The latching part 36 latches the internal address signal IAD until the clock signal CLK changes to low level.

As above, according to the first embodiment, the power supply line VDD is connected to the input node ND2 (ND1) of the CMOS inverter 36b (36a) through the two stages of pMOS transistors 32a and 34a (32b and 34b) connected in series. The voltage difference between the input nodes ND1 and ND2 can thus be widened quickly in accordance with the address signal AD. That is, the address signal AD can be latched into the latching part 36 with reliability. The improved operation margin of the input circuit 30 with respect to the power supply voltage VDD allows the address signal AD to be latched with reliability even if the power supply voltage VDD is low.

When the clock signal CLK is inactivated, the input nodes ND1 and ND2 are connected to the power supply line VDD by using the precharging part 38. Thus, the logic level of the address signal AD can be latched into the latching part 36 with reliability when the clock signal CLK is activated.

Since the output signals (/ND1, /ND2) amplified through the buffer part 42 are supplied to the feedback part 34, it is possible to reduce the time for the latching state of the latching part 36 to be determined.

Figure 5:
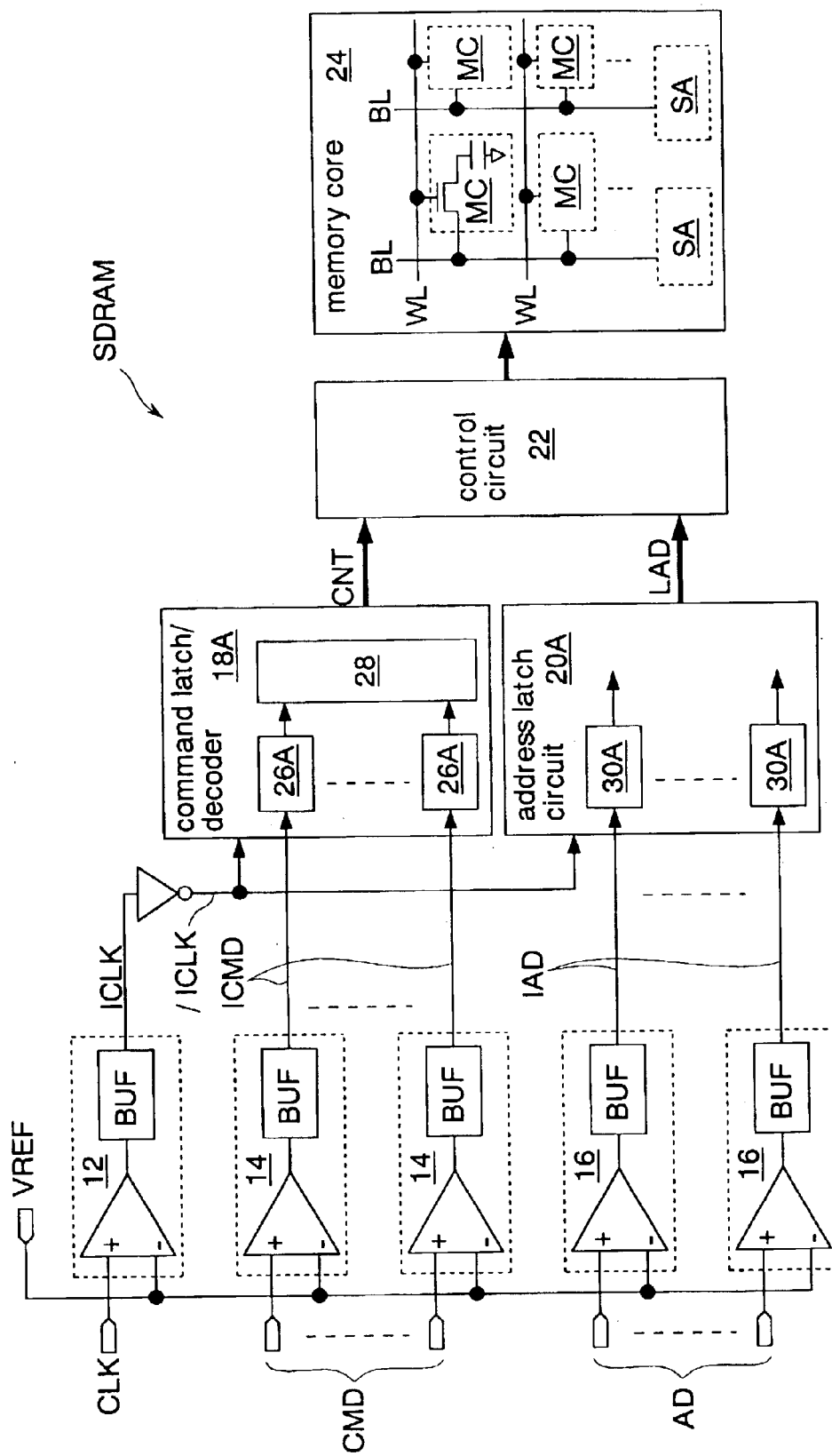
FIG. 5 is a block diagram showing a second embodiment of the semiconductor integrated circuit of the present invention.

FIG. 5 shows a second embodiment of the semiconductor integrated circuit of the present invention. The same elements as those of the first embodiment will be designated by identical reference numbers or symbols. Detailed description thereof will be omitted.

In this embodiment, a command latch/decoder 18A and an address latch circuit 20A are formed instead of the command latch/decoder 18 and the address latch circuit 20 of the first embodiment. Besides, the command latch/decoder 18A and the address latch circuit 20A are supplied with an internal clock signal /ICLK, or the internal clock signal ICLK inverted in phase. The rest of the configuration is the same as in the first embodiment.

The command latch/decoder 18A has input circuits 26A for receiving the internal command signal ICMD in synchronization with the internal clock signal /ICLK, and a command decoder 28 for decoding the internal command signal ICMD received. According to the decoding result, the command latch/decoder 18A outputs the core control signal CNT for operating the memory core 24.

The address latch circuit 20A has input circuits 30A which receive the internal address signal IAD in synchronization with the internal clock signal /ICLK and output the received signal as the latched address signal LAD.

Figure 6:
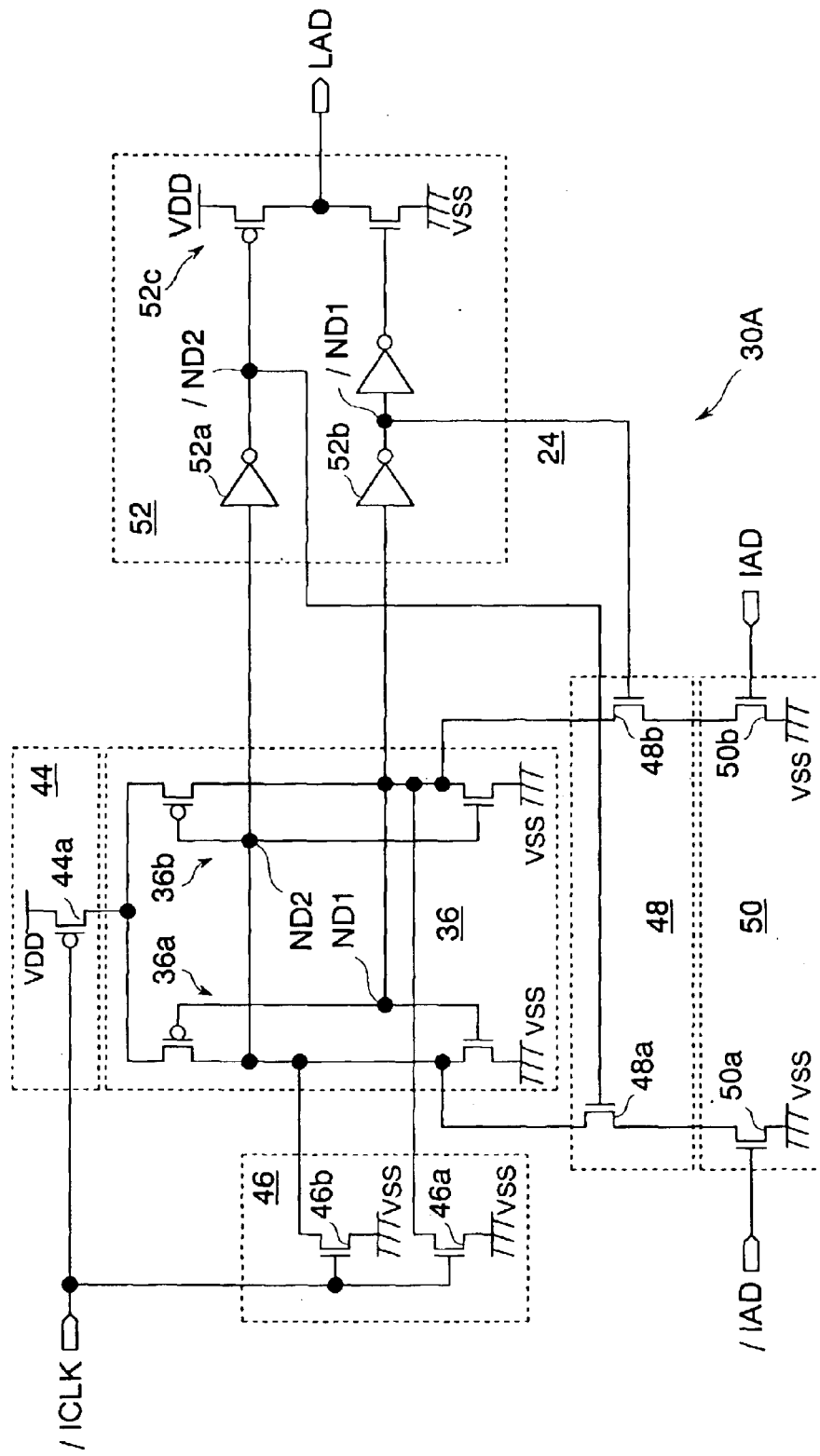
FIG. 6 is a circuit diagram showing the details of the input circuits of FIG. 5.

FIG. 6 shows the details of the input circuits 30A in the address latch circuit 20A shown in FIG. 5. Incidentally, the input circuits 26A of the command latch/decoder 18A are the same circuits as the input circuits 30A. Description will thus be omitted of the input circuits 26A.

The input circuits 30A are the input circuits 30 shown in FIG. 4, inverted in polarity. More specifically, by way of comparison between the input circuits 30A and the input circuits 30, the nMOS transistors and pMOS transistors, as well as the power supply line VDD and ground line VSS, are replaced with each other.

An input circuit 30A has a power supply connection part 44, a latching part 36, a precharging part 46, a feedback part 48, an input part 50, and a buffer part 52. The power supply connection part 44 consists of a pMOS transistor 44a which is connected to the latching part 36 at its drain. The pMOS transistor 44a is connected to the power supply line (first power supply line) VDD at its source, and receives the internal clock signal /ICLK at its gate.

The latching part 36 is composed of two CMOS inverters 36a and 36b having inputs and outputs connected to each other. The precharging part 46 is composed of two nMOS transistors 46a and 46b which are connected at their drains to the input nodes ND1 and ND2 of the CMOS inverters 36a and 36b, respectively. The nMOS transistors 46a and 46b are connected to the ground line (second power supply line) VSS at their sources, and receive the internal clock signal /ICLK at their gates.

The feedback part 48 is composed of nMOS transistors 48a and 48b (feedback switch circuit) which are connected to the nodes ND1 and ND2 at their drains, respectively. The gates of the nMOS transistors 48a and 48b receive the inverted levels of the nodes ND2 and ND1 (/ND2 and /ND1), respectively, which are supplied through the buffer part 52.

The input part 50 is composed of nMOS transistors 50a and 50b (input switch circuit) which are connected at their drains to the sources of the nMOS transistors 48a and 48b, respectively. The gates of the nMOS transistors 50a and 50b receive the internal address signals /IAD and IAD, respectively.

The buffer part 52 has inverters 52a and 52b for inverting the levels of the nodes ND2 and ND1, respectively, and an output circuit 52c. The output circuit 52c has a pMOS transistor and an nMOS transistor arranged in series between the power supply line VDD and the ground line VSS. The gate of the pMOS transistor of the output circuit 52c is connected to the node /ND2. The gate of the nMOS transistor of the output circuit 52c is connected to the node /ND1 through an inverter.

In the input circuit 30A shown in FIG. 6, when the internal clock signal /ICLK is at high level (inactivated state), the nMOS transistors 46a and 46b of the precharging part 46 turn on so that the input nodes ND1 and ND2 of the CMOS inverters 36a and 36b both change to low level. Here, the pMOS transistor 44a of the power supply connection part 44 is off. While the nodes ND1 and ND2 are at low level, the outputs of the inverters 52a and 52b of the buffer part 52, i.e., the nodes /ND1 and /ND2 are high in level, turning on the nMOS transistors 48a and 48b of the feedback part 48. Consequently, when the internal clock signal /ICLK is inactivated, the input nodes ND1 and ND2 of the CMOS inverters 36a and 36b are connected to the nMOS transistors 50a and 50b of the input part 50 through the nMOS transistors 48a and 48b of the feedback part 48.

Next, the internal address signal IAD is supplied before the internal clock signal /ICLK changes to low level (an activated state). The low level of the internal clock signal /ICLK turns off the nMOS transistors 46a, 46b of the precharging part 46 and turns on the pMOS transistor 44a of the power supply connection part 44. Since the pMOS transistor 44a is turned on, the latching part 36 is activated to be capable of latching the internal address signal IAD.

For example, when the internal address signal IAD is at high level, the nMOS transistor 50b turns on and the nMOS transistor 50a turns off. Since the nMOS transistors 48a and 48b of the feedback part 48 are on, the node ND1 alone is connected to the ground line VSS through the nMOS transistors 48b and 50b. The node ND1 falls in voltage and the node ND2 rises in voltage, turning on the pMOS transistor 36a and off the pMOS transistor 36b of the CMOS inverter 36. Consequently, an operation of opposite polarity from in the first embodiment is performed, whereby the internal address signal IAD of high level is latched into the latching part 36.

The inverters 52a and 52b of the buffer part 52 amplify the low level of the node ND1 and the high level of the node ND2, whereby the nodes /ND1 and /ND2 are changed to the power supply voltage VDD and the ground voltage VSS, respectively. The output circuit 52c of the buffer part 52 receives the low level of the node /ND2 and the inverted level (low level) of the node /ND1, and changes the latched address signal LAD to high level. That is, the logic level of the internal address signal IAD latched in the latching part 36 (the power supply voltage VDD) is output.

Moreover, the nMOS transistor 48b of the feedback part 48 remains turned on under the high level of the node /ND1. The nMOS transistor 48a of the feedback part 48 is turned off in response to the low level of the node /ND2. The input node ND1 of the CMOS inverter 36a is connected to the ground line VSS through the nMOS transistors 48b and 50b, so that the latching state of the latching part 36 is fixed irrespective of the level of the internal address signal IAD.

As above, the second embodiment can provide the same effects as those of the first embodiment.

Figure 7:
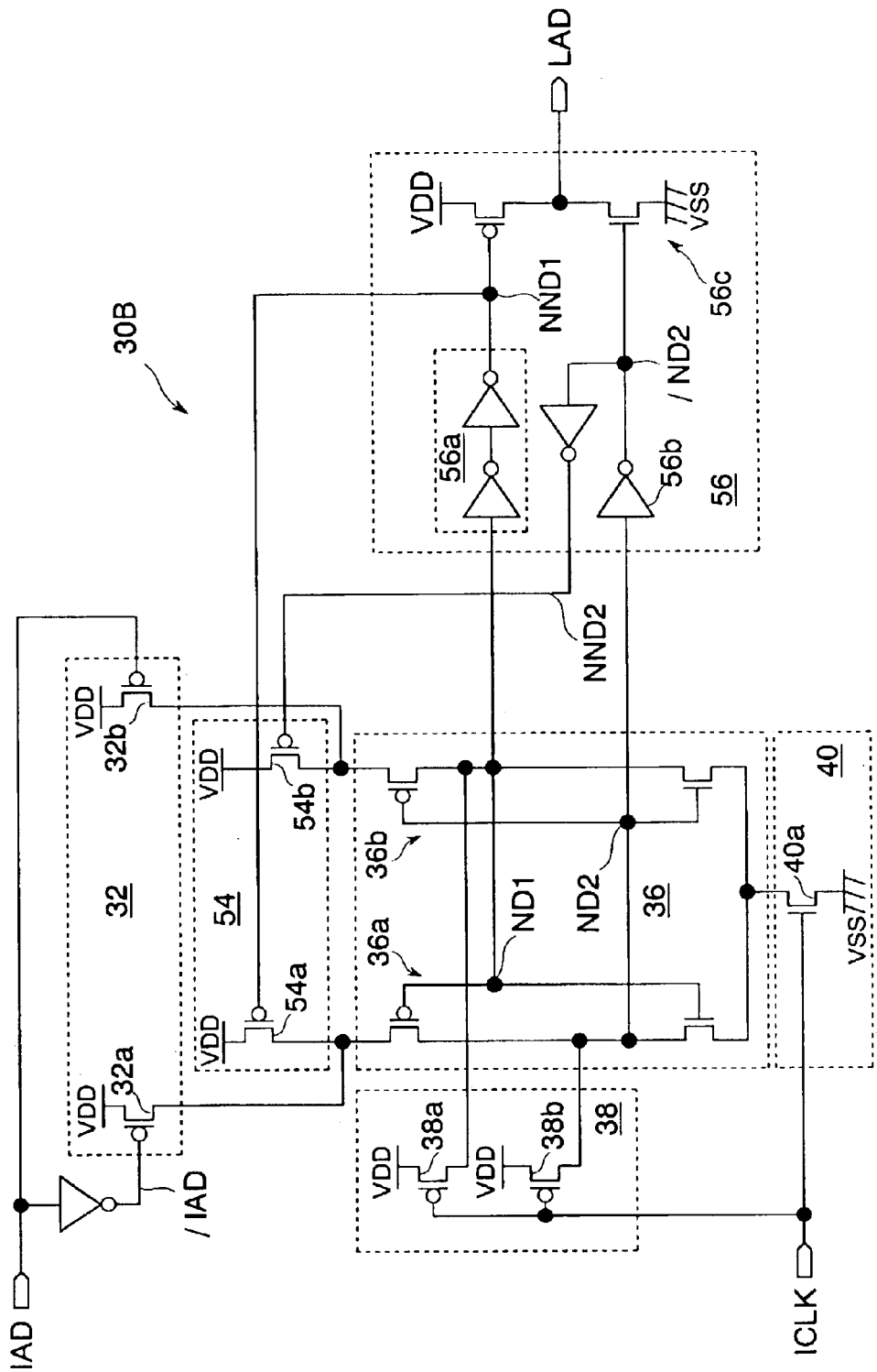
FIG. 7 is a circuit diagram showing the details of the input circuits according to a third embodiment of the semiconductor integrated circuit of the present invention.

FIG. 7 shows the details of input circuits 30B according to a third embodiment of the present invention. The same elements as those of the first embodiment described above will be designated by identical reference numbers or symbols. Detailed description thereof will be omitted.

The input circuits 30B are formed instead of the input circuits 30 of the first embodiment (FIG. 3). That is, the input circuits 30B receive the internal address signal IAD in synchronization with the internal clock signal ICLK and output the received signal as the latched address signal LAD. Incidentally, the input circuits of the command latch/decoder (not shown) formed on the SDRAM of this embodiment are the same circuits as the input circuits 30B.

An input circuit 30B has an input part 32, a feedback part 54, a latching part 36, a precharging part 38, a power supply connection part 40, and a buffer part 56.

In the input part 32, the gates of the pMOS transistors 32a and 32b receive the internal address signals /IAD and IAD, respectively. The drains of the pMOS transistors 32a and 32b are connected to the sources of the pMOS transistors of the CMOS inverters 36a and 36b. The sources of the pMOS transistors 32a and 23b are connected to the power supply line (second power supply line) VDD. The power supply voltage (second power supply voltage) VDD to be supplied to the power supply line VDD is set at 2.3 V.

The feedback part 54 is composed of pMOS transistors 54a and 54b which are connected at their drains to the sources of the pMOS transistors of the CMOS inverters 36a and 36b, respectively. The gates of the pMOS transistors 54a and 54b receive the same level (NND1) as that of the node ND1 and the inverted level (NND2) of the node /ND2, respectively, which are supplied through the buffer part 56. The sources of the pMOS transistors 54a and 54b are connected to the power supply line VDD.

The buffer part 56 has a buffer 56a for transmitting the logic level of the node ND1, an inverter 56b for inverting the logic level of the node ND2, and an output circuit 56c. The output circuit 56c has a pMOS transistor and an nMOS transistor arranged in series between the power supply line VDD and the ground line VSS. The gate of the pMOS transistor of the output circuit 56c is connected to the output of the buffer 56a, i.e., the node NND1. The gate of the nMOS transistor of the output circuit 56c is connected to the output of the inverter 56b, i.e., the node /ND2.

The input circuit 30B described above, as in the first embodiment, latches the internal address signal IAD in synchronization with the rising edge of the internal clock signal ICLK. The state when the internal clock signal ICLK is inactivated and the latching operation when the internal clock signal ICLK is activated are the same as in the first embodiment. Description thereof will thus be omitted.

In this embodiment, the input node ND1 of the CMOS inverter 36a is connected to the power supply line VDD through the pMOS transistor of the CMOS inverter 36b and the pMOS transistor 32b (or 54b). Similarly, the input node ND2 of the CMOS inverter 36b is connected to the power supply line VDD through the pMOS transistor of the CMOS inverter 36a and the pMOS transistor 32a (or 54a). That is, the input nodes ND1 and ND2 are connected to the power supply line VDD through two stages of transistors connected in series. This is one stage fewer than heretofore (FIGS. 1 and 2). Consequently, even if the power supply voltage VDD is as low as 2.3 V. the voltage difference between the nodes ND1 and ND2 can be widened quickly and surely in accordance with the internal address signal IAD. In addition, the pMOS transistors 32a and 32b, both having an amplifying function, are directly connected to the power supply line VDD at their sources. Small changes in the voltage of the internal address signal IAD can thus be amplified and output to the drains of the pMOS transistors 32a and 32b quickly with reliability. As a result, the operation margin of the input circuits 30B with respect to the power supply voltage improves as compared to heretofore.

As above, the third embodiment can provide the same effects as those of the first embodiment.

Figure 8:
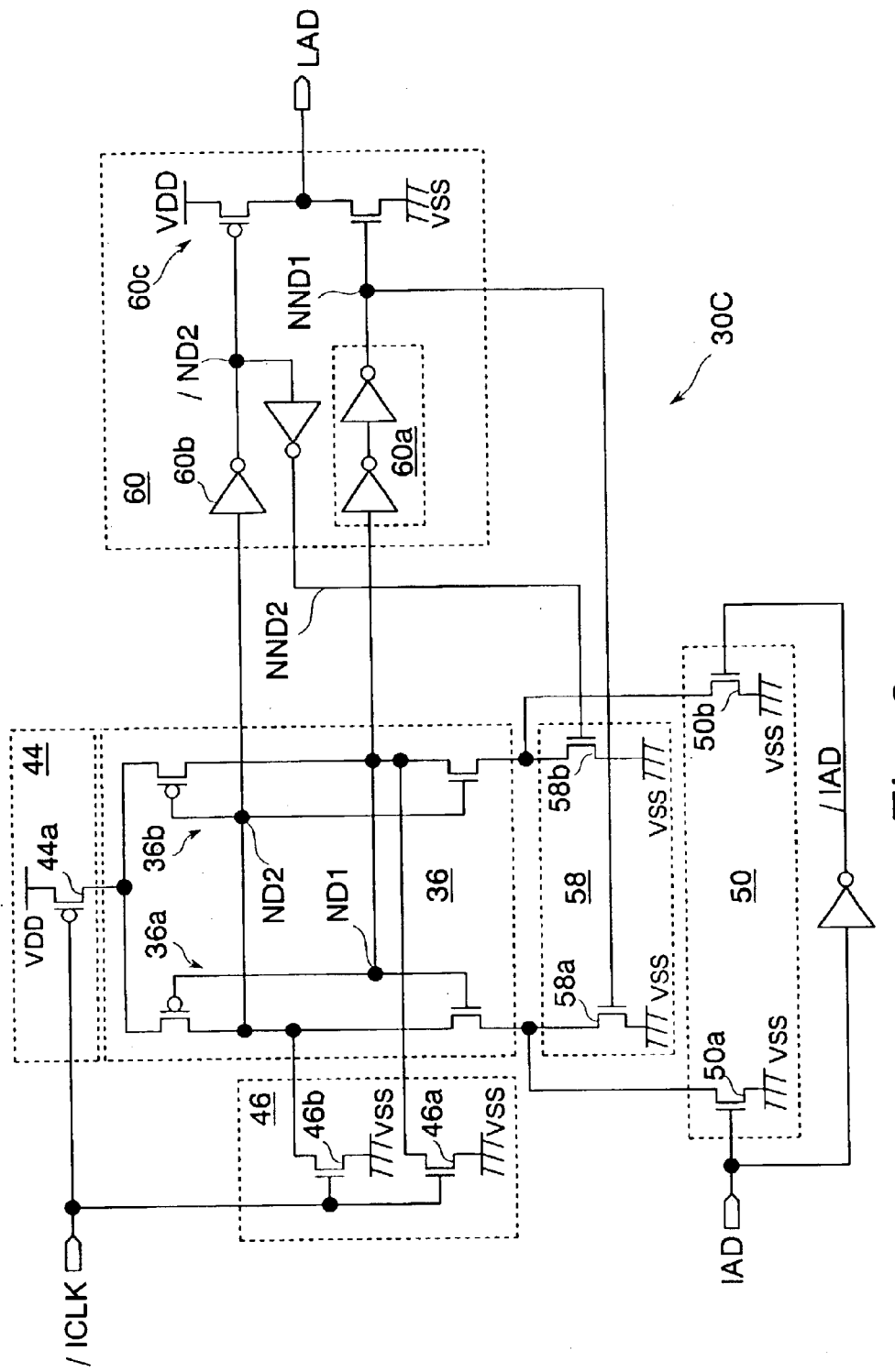
FIG. 8 is a circuit diagram showing the details of the input circuits according to a fourth embodiment of the semiconductor integrated circuit of the present invention.

FIG. 8 shows the details of input circuits 30C according to a fourth embodiment of the present invention. The same elements as those of the second embodiment described above will be designated by identical reference numbers or symbols. Detailed description thereof will be omitted.

The input circuits 30C are formed instead of the input circuits 30A of the second embodiment (FIG. 6). That is, the input circuits 30C receive the internal address signal IAD in synchronization with the internal clock signal /ICLK and output the received signal as the latched address signal LAD. Incidentally, the input circuits of the command latch/decoder (not shown) formed on the SDRAM of this embodiment are the same circuits as the input circuits 30C.

The input circuits 30C are the input circuits 30B shown in FIG. 7, inverted in polarity. More specifically, by way of comparison between the input circuits 30C and the input circuits 30B, the nMOS transistors and pMOS transistors, as well as the power supply line VDD and ground line VSS, are replaced with each other.

An input circuit 30C has a power supply connection part 44, a latching part 36, a precharging part 46, a feedback part 58, an input part 50, and a buffer part 60. The feedback part 58 is composed of nMOS transistors 58a and 58b which are connected at their drains to the sources of the nMOS transistors of the CMOS inverters 36a and 36b, respectively. The gates of the nMOS transistors 58a and 58b receive the same level (NND1) as that of the node ND1 and the inverted level (NND2) of the node /ND2, respectively, which are supplied through the buffer part 60. The sources of the nMOS transistors 58a and 58b are connected to the ground line VSS.

The buffer part 60 has a buffer 60a for transmitting the logic level of the node ND1, an inverter 60b for inverting the logic level of the node ND2, and an output circuit 60c. The output circuit 60c has a pMOS transistor and an nMOS transistor arranged in series between the power supply line VDD and the ground line VSS. The gate of the pMOS transistor of the output circuit 60c is connected to the output of the inverter 60b, i.e., the node /ND2. The gate of the nMOS transistor of the output circuit 60c is connected to the output of the buffer 60a, i.e., the node NND1.

The input circuit 30C described above, as in the second embodiment, latches the internal address signal IAD in synchronization with the falling edge of the internal clock signal /ICLK. The state when the internal clock signal /ICLK is inactivated and the latching operation when the internal clock signal /ICLK is activated are the same as in the second embodiment. Description thereof will thus be omitted.

As above, the fourth embodiment can provide the same effects as those of the first and second embodiments.

Figure 9:
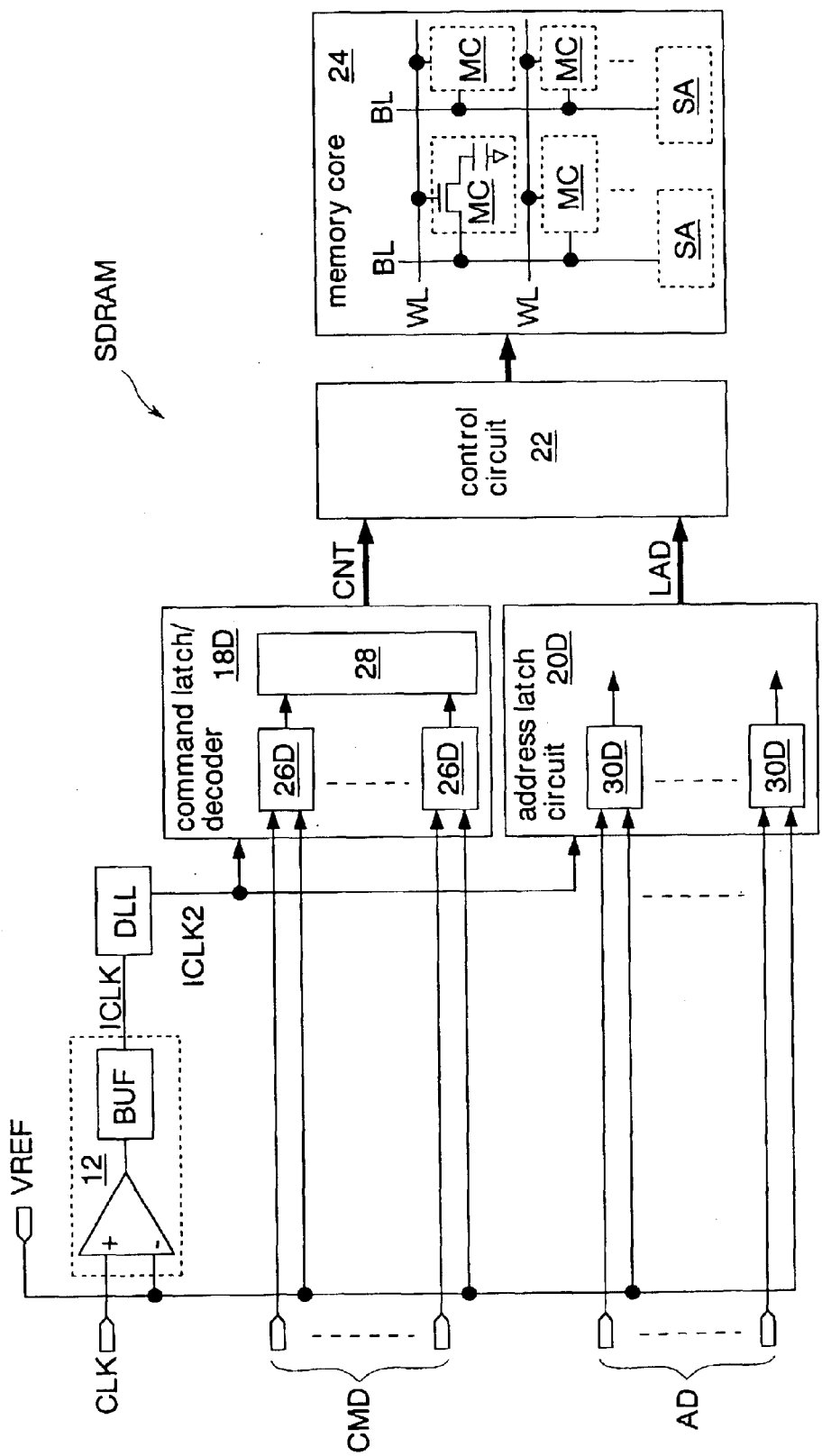
FIG. 9 is a block diagram showing a fifth embodiment of the semiconductor integrated circuit of the present invention.

FIG. 9 shows a fifth embodiment of the present invention. The same elements as those of the first embodiment described above will be designated by identical reference numbers or symbols. Detailed description thereof will be omitted.

In this embodiment, the command signal CMD and the address signal AD supplied to the external terminals of the SDRAM are supplied directly to input circuits 26D and 30D without the intervention of input buffers. Moreover, the SDRAM has a phase adjustment circuit DLL for adjusting the phase of the internal clock signal ICLK. The phase adjustment circuit DLL adjusts the internal clock signal ICLK to the clock signal CLK in phase and outputs the resultant as an internal clock signal ICLK2. That is, the phase adjustment circuit DLL functions as a DLL (Delayed Locked Loop) circuit for advancing the phase of the internal clock signal ICLK by the delay time of the clock buffer 12 which receives the clock signal CLK. The rest of the configuration is the same as in the first embodiment.

Figure 10:
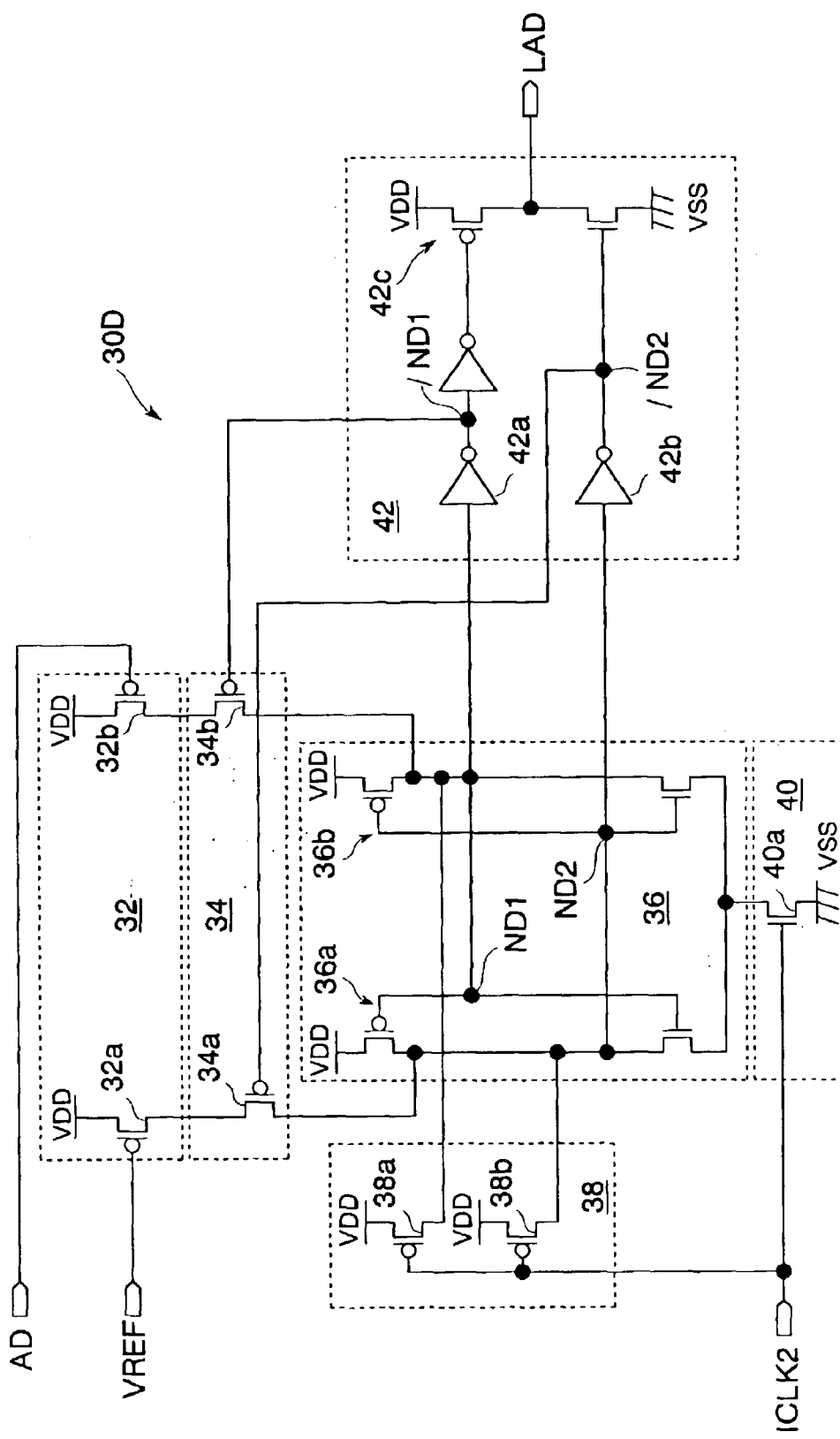
FIG. 10 is a circuit diagram showing the details of the input circuits of FIG. 9.

FIG. 10 shows the details of the input circuits 30D in the address latch circuit 20D shown in FIG. 9. Incidentally, the input circuits 26D of the command latch/decoder 18D are the same circuits as the input circuits 30D. Description will thus be omitted of the input circuits 26D.

The input circuits 30D are the same circuits as the input circuits 30 of the first embodiment except in that different signals are input thereto. More specifically, the gate of the pMOS transistor 32a of the input part 32 is supplied with a reference voltage VREF, not the internal address signal /IAD. The gate of the pMOS transistor 32b of the input part 32 is supplied with the address signal AD directly. The gates of the pMOS transistors 38a, 38b of the precharging part 38 and the gate of the nMOS transistor 40a of the power supply connection part 40 are supplied with the internal clock signal ICLK2, not the internal clock signal ICLK.

The reference voltage VREF is a voltage between the minimum input voltage at the high-level side (typically represented as a voltage specification VIH) and the maximum input voltage at the low-level side (typically represented as a voltage specification VIL) of the input signal (AD or CMD). The reference voltage VREF is generated by a not-shown voltage generator formed on the SDRAM. Otherwise, the reference voltage VREF is input from the exterior of the SDRAM.

In the input circuit 300 shown in FIG. 10, when the voltage of the address signal AD is higher than the reference voltage VREF, the pMOS transistor 32b for receiving the address signal AD exceeds the pMOS transistor 32a for receiving the reference voltage VREF in source-to-drain resistance. This raises the voltage of the node ND2, making the latching part 36 out of balance. The subsequent operations are the same as those of the input circuits 30 in the first embodiment. Incidentally, the amplitude of the address signal AD is smaller than the voltage difference between the power supply voltage VDD and the ground voltage VSS.

Now, when the voltage of the address signal AD is lower than the reference voltage VREF, the pMOS transistor 32b for receiving the address signal AD falls below the pMOS transistor 32a for receiving the reference voltage VREF in source-to-drain resistance. This raises the voltage of the node ND1, making the latching part 36 out of balance. The subsequent operations are the same as those of the input circuits 30 of the first embodiment.

In this embodiment, the source of the pMOS transistor 32a for receiving the reference voltage VREF is connected directly to the power supply line VDD. Consequently, when the input circuit 30D is in operation, the source of the pMOS transistor 32a is fixed to the power supply voltage VDD.

Voltage variations at the drain of the pMOS transistor 32a become significantly smaller than heretofore. This makes the reference voltage VREF less susceptible to coupling noise resulting from voltage variations across the source and drain of the pMOS transistor 32a. As a result, the input circuit 30D can be prevented from malfunction (incorrect latch of the address signal AD).

On the contrary, in the conventional input circuit (FIG. 2), the pMOS transistors 9a and 9b of the input part 9 are connected to the power supply line VDD through the pMOS transistor 10a of the power supply connection part 10. In latching the input signal IN, the pMOS transistor 9b for receiving the reference voltage VREF thus varies at both the source pMOS transistor 9b.

Figure 11:
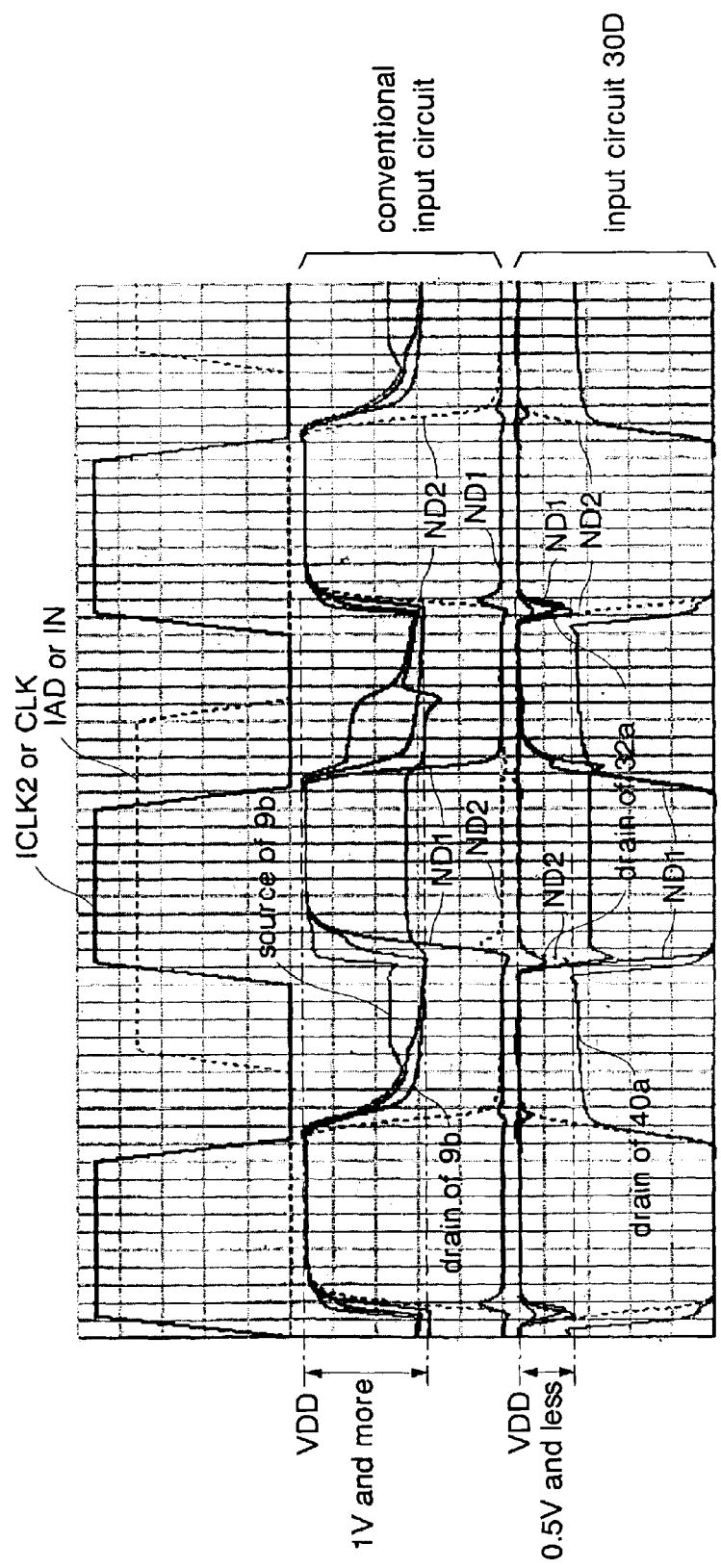
FIG. 11 is a waveform chart showing the operation of the input circuit of FIG. 10.

FIG. 11 shows the operation of the input circuit 30D shown in FIG. 10 (waveforms from a circuit simulation). For a comparative example, the operating waveforms of the conventional input circuit shown in FIG. 2 are presented.

In the conventional input circuit (FIG. 2), the source and drain of the MOS transistor 9b for receiving the reference voltage VREF vary 1 V and more in voltage. On the other hand, in the input circuit 30D, the drain of the pMOS transistor 32a for receiving the reference voltage VREF shows voltage variations of 0.5 V and less. That is, the reference voltage VREF is less susceptible to the coupling noise of the pMOS transistor 32a.

As above, the fifth embodiment can provide the same effects as those of the first embodiment. In addition, the operation margin can be improved even if the input circuits 30D are supplied with an address signal AD of smaller amplitude. The address signal AD can thus be latched with reliability.

The foregoing second embodiment (FIG. 6) has dealt with the case where the input part 50 is supplied with the complementary internal address signals IAD and /IAD, and the precharging part 46 and the power supply connection part 44 are supplied with the internal clock signal /ICLK. The present invention is not limited thereto. For example, as in the fifth embodiment, the input part 50 may directly receive the address signal AD that is supplied to the external terminal. In this case, the gate of the nMOS transistor 50a of the input part 50 is supplied with the reference voltage VREF. The precharging part 46 and the power supply connection part 44 are then supplied with an internal clock signal /ICLK2 that deviates from the clock signal CLK by 180° in phase.

Figure 12:
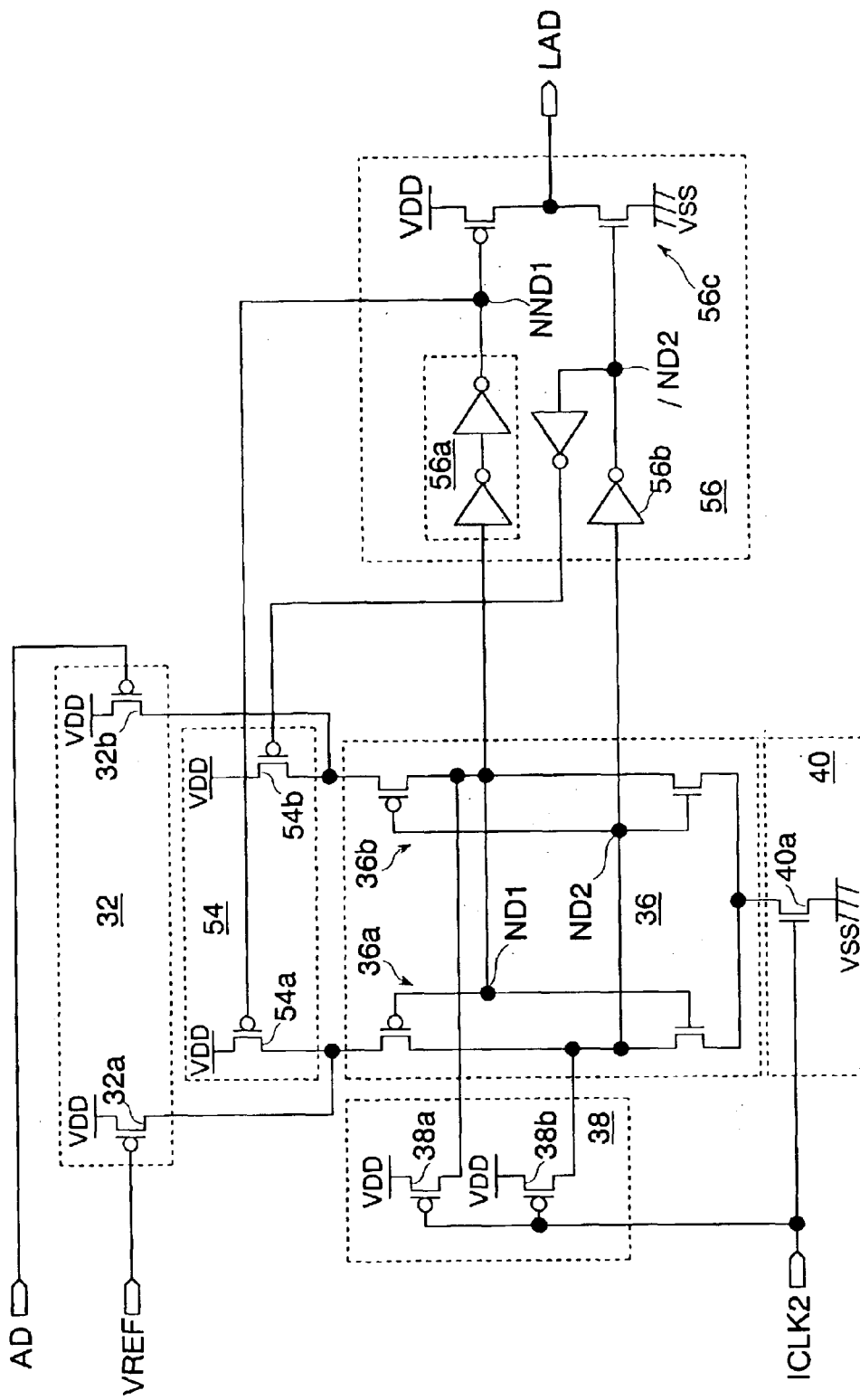
FIG. 12 is a circuit diagram showing another example of the input circuit.

Similarly, as shown in FIG. 12, the gates of the pMOS transistors 32a and 32b of the input part 32 in the third embodiment (FIG. 7) may be supplied with the reference voltage VREF and the address signal AD, respectively. Here, the gates of the pMOS transistors 38a, 38b of the precharging part 38 and the gate of the nMOS transistor 40a of the power supply connection part 40 are supplied with the internal clock signal ICLK2.

The gate of the nMOS transistor 50a of the input part 50 in the fourth embodiment (FIG. 8) may also be supplied with the reference voltage VREF. Here, the precharging part 46 and the power supply connection part 44 are supplied with the internal clock signal /ICLK2 which deviates from the clock signal CLK by 180° in phase.

The data latch circuit described in the first embodiment may be applied to the second to fifth embodiments.

The foregoing embodiments have dealt with the cases where the present invention is applied to an SDRAM. The present invention is not limited thereto. For example, the present invention may be applied to such semiconductor integrated circuits as SSRAMs, microcomputers, logic LSIs, and system LSIs.

The invention is not limited to the above embodiments and various modifications may be made without departing from the spirit and scope of the invention. Any improvement may be made in part or all of the components.

What is claimed is:

1. A semiconductor integrated circuit having an input circuit for receiving an input signal, said input circuit comprising:

a latching part having two inverting circuits operating by receiving a first power supply voltage and a second power supply voltage, said inverting circuits having inputs and outputs connected to each other;

a power supply connection part for connecting said inverting circuits to a first power supply line in response to an activation of a control signal, said first power supply line being supplied with said first power supply voltage; and an input part and a feedback part arranged in series between a second power supply line and input nodes of said inverting circuits, said second power supply line being supplied with said second power supply voltage, said input part having an input switch circuit for connecting said second power supply line to one of said input nodes through said feedback part in accordance with said input signal and said feedback part having a feedback switch circuit for connecting said one of the input nodes to said input part in accordance with a level of an output signal output from said latching part.

2. The semiconductor integrated circuit according to claim 1, wherein
said input switch circuit has transistors for receiving said input signal and an inverted signal of said input signal at their respective gates, said transistors being connected to said input nodes of said inverting circuits through said feedback switch circuit, respectively.

3. The semiconductor integrated circuit according to claim 2, wherein
the sources of said transistors of said input switch circuit are connected directly to second power supply line.

4. The semiconductor integrated circuit according to claim 1, wherein
said input switch circuit has transistors for receiving said input signal and a reference voltage at their respective gates, said transistors being connected to said input nodes of said inverting circuits through said feedback switch circuit, respectively.

5. The semiconductor integrated circuit according to claim 4, wherein
the sources of said transistors of said input switch circuit are connected directly to said second power supply line.

6. The semiconductor integrated circuit according to claim 1, further comprising
a precharging part for setting said input nodes of said inverting circuits at a predetermined voltage when said control signal is inactivated.

7. The semiconductor integrated circuit according to claim 6, wherein
said predetermined voltage is a voltage for turning on said feedback switch circuit.

8. The semiconductor integrated circuit according to claim 1, further comprising a buffer part for amplifying said output signal output from said latching part, and wherein
said feedback part receives said output signal amplified through said buffer part.

9. The semiconductor integrated circuit according to claim 1, wherein:
said inverting circuits are composed of CMOS inverters;
said power supply connection part includes an nMOS transistor for receiving said control signal at its gate;
said input part is composed of pMOS transistors for receiving said input signal and an inverted signal of said input signal at their gates, said pMOS transistors being connected to said second power supply line at their sources;
said feedback part is composed of pMOS transistors for receiving said output signal and an inverted signal of said output signal at their gates; and
said first power supply voltage is lower than said second power supply voltage.

10. The semiconductor integrated circuit according to claim 1, wherein:
said inverting circuits are composed of CMOS inverters;
said power supply connection part includes a pMOS transistor for receiving said control signal at its gate;
said input part is composed of nMOS transistors for receiving said input signal and an inverted signal of said input signal at their gates, said nMOS transistors being connected to said second power supply line at their sources;
said feedback part is composed of nMOS transistors for receiving said output signal and an inverted signal of said output signal at their gates; and
said first power supply voltage is higher than said second power supply voltage.

11. The semiconductor integrated circuit according to claim 1, further comprising:
a memory core having memory cells;
a command latch circuit having said input circuit for receiving a command signal as said input signal; and
a command decoder for generating a core control signal for performing a write operation or a read operation on said memory core, in accordance with said command signal received by said command latch circuit.

12. The semiconductor integrated circuit according to claim 11, wherein
said input circuit of said command latch circuit receives said command signal in response to a clock signal that is said control signal.

13. The semiconductor integrated circuit according to claim 1, further comprising:
a memory core having memory cells; and
an address receiver circuit having said input circuit for receiving, as said input signal, an address signal for selecting said memory cells to which a write operation or a read operation is performed.

14. The semiconductor integrated circuit according to claim 13, wherein
said input circuit of said address receiver circuit receives said address signal in response to a clock signal that is said control signal.

15. A semiconductor integrated circuit having an input circuit for receiving an input signal, said input circuit comprising:
a latching part having two inverting circuits operating by receiving a first power supply voltage and a second power supply voltage, said inverting circuits having inputs and outputs connected to each other;

a power supply connection part for connecting said inverting circuits to a first power supply line in response to an activation of a control signal, said first power supply line being supplied with said first power supply voltage; and an input part and a feedback part arranged in parallel between a second power supply line and said latching part to directly receive said second power supply voltage being supplied to said second power supply line, said input part having an input switch circuit for connecting said second power supply line to one of said inverting circuits in accordance with said input signal and said feedback part having a feedback switch circuit for connecting said second power supply line to said one of the inverting circuits in accordance with a level of an output signal output from said latching part.

16. The semiconductor integrated circuit according to claim 15, wherein said input switch circuit has transistors for receiving said input signal and an inverted signal of said input signal at their respective gates, said transistors being connected to said inverting circuits, respectively.

17. The semiconductor integrated circuit according to claim 16, wherein the sources of said transistors of said input switch circuit are connected directly to said second power supply line.

18. The semiconductor integrated circuit according to claim 15, wherein said input switch circuit has transistors for receiving said input signal and a reference voltage at their respective gates, said transistors being connected to said inverting circuits, respectively.

19. The semiconductor integrated circuit according to claim 18, wherein the sources of said transistors of said input switch circuit are connected directly to said second power supply line.

20. The semiconductor integrated circuit according to claim 15, further comprising a precharging part for setting input nodes of said inverting circuits at a predetermined voltage when said control signal is inactivated.

21. The semiconductor integrated circuit according to claim 20, wherein said predetermined voltage is a voltage for turning off said feedback switch circuit.

22. The semiconductor integrated circuit according to claim 15, further comprising a buffer part for amplifying said output signal output from said latching part, and wherein
said feedback part receives said output signal amplified through said buffer part.

23. The semiconductor integrated circuit according to claim 15, wherein:

said inverting circuits are composed of CMOS inverters;

said power supply connection part includes an nMOS transistor for receiving said control signal at its gate;

said input part is composed of pMOS transistors for receiving said input signal and and inverted signal of said input signal at their gates, said pMOS transistors being connected to said second power supply line at their sources;

said feedback part is composed of pMOS transistors for receiving said output signal and an inverted signal of said output signal at their gates; and said first power supply voltage is lower than said second power supply voltage.

24. The semiconductor integrated circuit according to claim 15, wherein:

said inverting circuits are composed of CMOS inverters;

said power supply connection part includes a pMOS transistor for receiving said control signal at its gate;

said input part is composed of nMOS transistors for receiving said input signal and an inverted signal of said input signal at their gates, said nMOS transistors being connected to said second power supply line at their sources;

said feedback part is composed of nMOS transistors for receiving said output signal and an inverted signal of said output signal at their gates; and said first power supply voltage is higher than said second power supply voltage.

25. The semiconductor integrated circuit according to claim 15, further comprising:

a memory core having memory cells;

a command latch circuit having said input circuit for receiving a command signal as said input signal; and a command decoder for generating a core control signal for performing a write operation or a read operation on said memory core, in accordance with said command signal received by said command latch circuit.

26. The semiconductor integrated circuit according to claim 25, wherein said input circuit of said command latch circuit receives said command signal in response to a clock signal that is said control signal.

27. The semiconductor integrated circuit according to claim 26, wherein said input circuit of said address receiver circuit receives said address signal in response to a clock signal that is said control signal.

28. The semiconductor integrated circuit according to claim 15, further comprising:

a memory core having memory cells; and an address receiver circuit having said input circuit for receiving, as said input signal, an address signal for selecting said memory cells to which a write operation or a read operation is performed.

* * * * *